(12) United States Patent
Kang

(10) Patent No.: US 6,356,488 B1
(45) Date of Patent: Mar. 12, 2002

(54) BIAS LEVEL GENERATING CIRCUIT IN A FLASH MEMORY DEVICE

(75) Inventor: Han Kook Kang, Kimpho-shi (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/722,107

(22) Filed: Nov. 27, 2000

(30) Foreign Application Priority Data

Dec. 27, 1999 (KR) ............................................ 99-62953

(51) Int. Cl.$^7$ ................................................. G11C 7/00
(52) U.S. Cl. ............................ 365/189.09; 365/185.23; 365/226
(58) Field of Search ....................... 365/189.09, 185.23, 365/226, 189.05, 185.18, 185.33, 189.11; 327/540, 541

(56) References Cited

U.S. PATENT DOCUMENTS

| | | | | |
|---|---|---|---|---|
| 5,291,446 A | * | 3/1994 | Van Buskirk et al. | 365/189.09 |
| 5,444,412 A | * | 8/1995 | Kowalski | 327/541 |
| 5,511,026 A | * | 4/1996 | Clevaland et al. | 365/189.09 |
| 5,822,247 A | * | 10/1998 | Tassan Caser et al. | 365/185.18 |
| 6,002,630 A | * | 12/1999 | Chuang et al. | 365/226 |
| 6,275,099 B1 | * | 8/2001 | Ghilardelli | 327/540 |

* cited by examiner

Primary Examiner—David Nelms
Assistant Examiner—Gene N. Auduong
(74) Attorney, Agent, or Firm—Pennie & Edmonds LLP

(57) ABSTRACT

The bias level generation circuit in a flash memory device comprises a first inverter for inverting an enable signal, a first switching element switched depending on the output signal from the first inverter, a charge pump for generating a pump-out voltage necessary when generating a bias level depending on the power supply send via the first switching element and the enable signal, a bias switch circuit for preventing oscillation of the pump-out voltage in order to generate a bias level for use in the programming or the programming verification of a cell, depending on a program signal, and a regulator for making the voltage generated in the bias switch circuit being a bias level suitable for the programming or the programming verification of the cell, by setting a specific path current depending on the program signal. Thus, the present invention can prevent a malfunction of a device due to oscillation of word lines, by supplying word lines with stabilized bias levels the bias levels of which are different depending on the programming step or the programming verification step.

23 Claims, 3 Drawing Sheets

BIAS LEVEL GENERATING CIRCUIT IN A FLASH MEMORY DEVICE

FIELD OF THE INVENTION

The invention relates generally to a bias level generating circuit in a flash memory device for generating bias levels suitable for a programming or a programming verification of a cell.

BACKGROUND OF THE INVENTION

Referring now to FIG. 1, a bias level generating circuit in the conventional flash memory device will be explained below. The bias level generating circuit is consisted of a first inverter I1 for inverting an enable signal EN, a first switching element P1 for transferring the power supply to a charge pump 10 according to the output signal from the first inverter I1, a charge pump 10, a voltage dividing diode, a regulation sense amplifier 20, and switching elements and resistors for forming a current path.

The charge pump 10 generates a pump-out voltage PUMP_OUT according to the enable signal EN and the power supply. The voltage dividing diode is consisted of a plurality of diodes connected serially, for falling the pump-out voltage PUMP_OUT. The regulation sense amplifier 20 senses the signal the voltage of which is fallen by the plurality of diodes to generate a current path enable signal, according to the regulation enable signal REG_EN. The second switching element NI forms the current path to the output terminal of the charge pump 10 along with the first resistor R1, according to the output signal from the regulation sense amplifier 20.

Below, the operation of the circuit will be explained.

If the enable signal EN is applied with a High state, the first inverter I1 inverts the enable signal EN to turn on the first switching element P1. Then, the first switching element P1 turned on transfers the power supply to the charge pump 10. The voltage of the output signal from the charge pump has fallen by the plurality of diodes D1–D4 and is applied to the regulation sense amplifier. Then, the regulation sense amplifier 20 driven according to the regulation enable signal REG_EN senses the output signal of the charge pump 10 the voltage of which has fallen, thus turning on the second switching element N1. Next, a current path extending from the pump-out voltage PUMP_OUT of the charge pump 10 to the first resistor R1 is formed by the first switching element N1, so that the pump-out voltage is controlled to a bias level for use in a programming or a programming verification of the cell.

As mentioned above, in the conventional charge pump and regulation circuit structure, a single charge pump and a single regulator generate different biases levels necessary for a programming or a programming verification of a cell. Thus, the regulator having this structure has only a single current path (discharge path) and therefore the size of the transistor for current path must be fitted to a high bias. Therefore, in case that a low bias is generated using this circuit structure, there is a problem that it consumes a lot of time to discharge the current using a transistor for use in a high bias current path, in order to adjust the current to a desired level. Also, there is a problem that oscillation in the bias level is severe because a great current has to be discharged at a time. This oscillation causes malfunction in the programming verification of a flash memory cell.

SUMMARY OF THE INVENTION

It is therefore an object of the present invention to provide a bias level generating circuit in a flash memory device capable of preventing oscillations, by which a bias level suitable for a corresponding operation is generated, when a programming operation or a programming verification operation is performed.

In order to accomplish the above object, a bias level generating circuit in a flash memory device according to the present invention is characterized in that it comprises a first inverter for inverting an enable signal, a first switching element switched depending on the output signal from the first inverter, a charge pump for generating a pump-out voltage necessary when generating a bias level depending on the power supply send via the first switching element and the enable signal, a bias switch circuit for preventing oscillation of the pump-out voltage in order to generate a bias level necessary for a programming or a programming verification of a cell, depending on a program signal, and a regulator for making the voltage generated in the bias switch circuit being a bias level suitable for the programming or the programming verification of the cell, by setting a specific path current depending on the program signal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
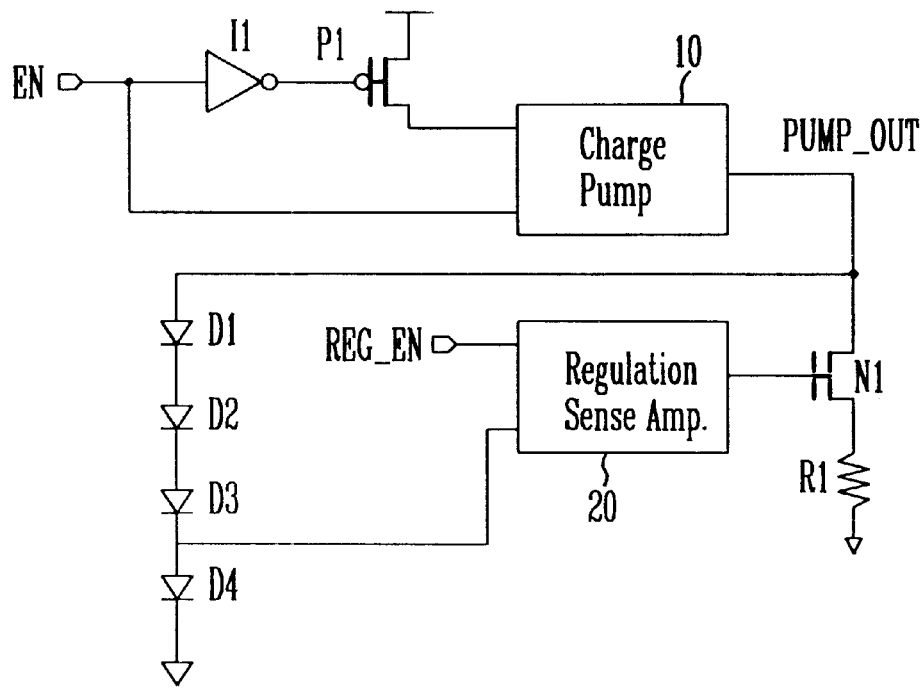
FIG. 1 is a circuit diagram for explaining a bias level generating circuit in the conventional flash memory device.

The present invention will be described in detail by way of a preferred embodiment with reference to accompanying drawings, in which like reference numerals are used to identify the same or similar parts.

Figure 2:
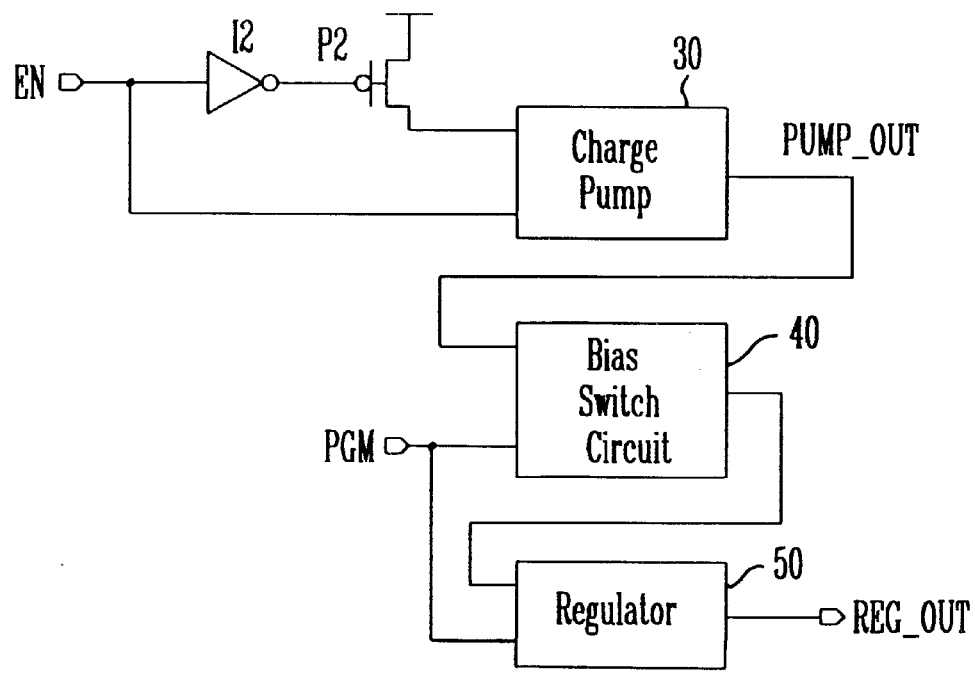
FIG. 2 is a circuit diagram for explaining a bias level generating circuit in a flash memory device according to the present invention.

FIG. 2 is a circuit diagram for explaining a bias level generating circuit in a flash memory device according to the present invention.

In the regulation circuit in the flash memory device, an initial bias specification circuit using a programmable cell is consisted of a first inverter I2 for inverting an enable signal EN, a first switching element P2 for transferring the power supply to a charge pump 30 depending on the first inverter I2, a charge pump 30 for generating a pump-out voltage PUMP_OUT necessary for the programming or the programming verification of the cell depending on the power supply and the enable signal EN, a bias regulation switch circuit 40, and a regulator 50.

Figure 3:
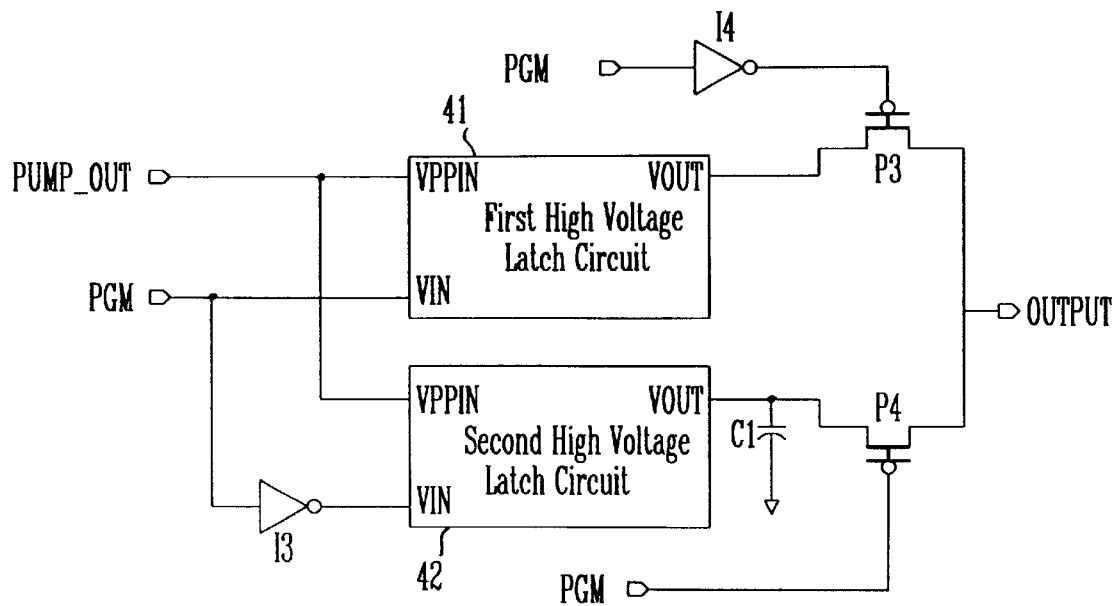
FIG. 3 is an internal circuit diagram for explaining the bias switch circuit shown in FIG. 2.

FIG. 3 is an internal circuit diagram for explaining the bias switch circuit shown in FIG. 2.

The bias switch circuit 40 generates a bias level specification signal OUTPUT for setting a bias level (Bias Level) suitable for a program level or a verification level of the cell depending on the program signal PGM.

Also, the bias switch circuit 40 is consisted of second and third inverters I3 and I4 for inverting the program signal PGM, a second switching element P3 to be switched depending on the inverter I4, first and second high voltage latch circuits 41 and 42, a third switching element to be switched depending on the program signal PGM and a first capacitor connected to the output terminal of the second high voltage latch circuit 42.

The first high voltage latch circuit 41 generates a first output signal Vout1 according to the pump-out voltage PUMP_OUT of the charge pump 30 and the program signal PGM.

The second high voltage latch circuit 42 generates a second output signal Vout2 according to the pump-out voltage PUMP_OUT of the charge pump 30 and the program signal PGM inverted by the second inverter I3.

The first and second output signals Vout1 and Vout2 are selectively transferred to the output terminals by the second and third switching elements P3 and P4 according to the program signal PGM.

Figure 4:
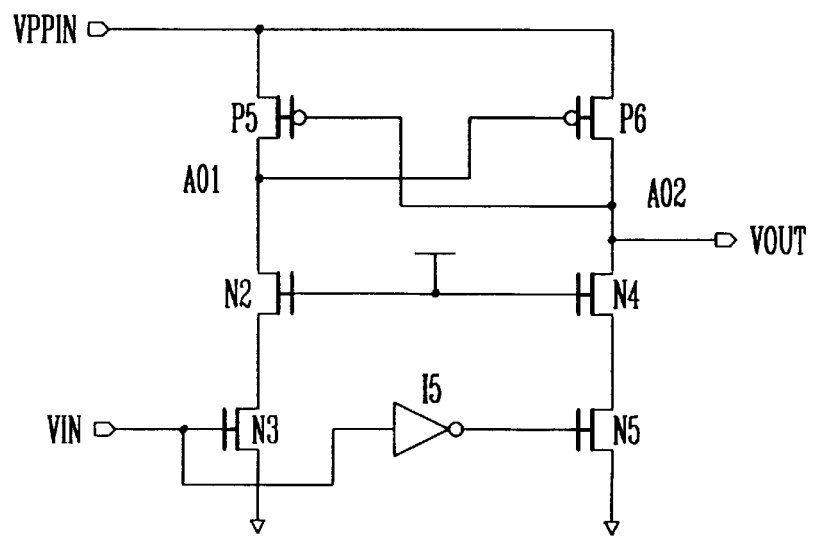
FIG. 4 is an internal circuit diagram for explaining the high voltage latch circuit shown in FIG. 3.

FIG. 4 is an internal circuit diagram of the high voltage latch circuits 41 and 42.

The high voltage latch circuits 41 and 42 includes a fourth inverter I5 for inverting the input signal applied to the first input terminal Vin, a fourth switching element N3 serially connected between a first node A01 and the ground and also switched depending on the input signal applied to the first input terminal Vin and a fifth switching element N2 always kept ON by the power supply, a sixth switching element N5 serially connected between the second node A02 and the ground and switched depending on the output signal of the fourth inverter I5 and a seventh switching element N4 always kept ON by the power supply, a eighth switching element P5 connected between the second input terminal Vppin and the first node A01 and switched depending on the voltage level of the second node A02, a ninth switching element P6 connected between the second input terminal Vppin and the second node A02 and switched depending on the voltage level of the first node A01, and an output signal being the voltage level of the second node A02.

Figure 5:
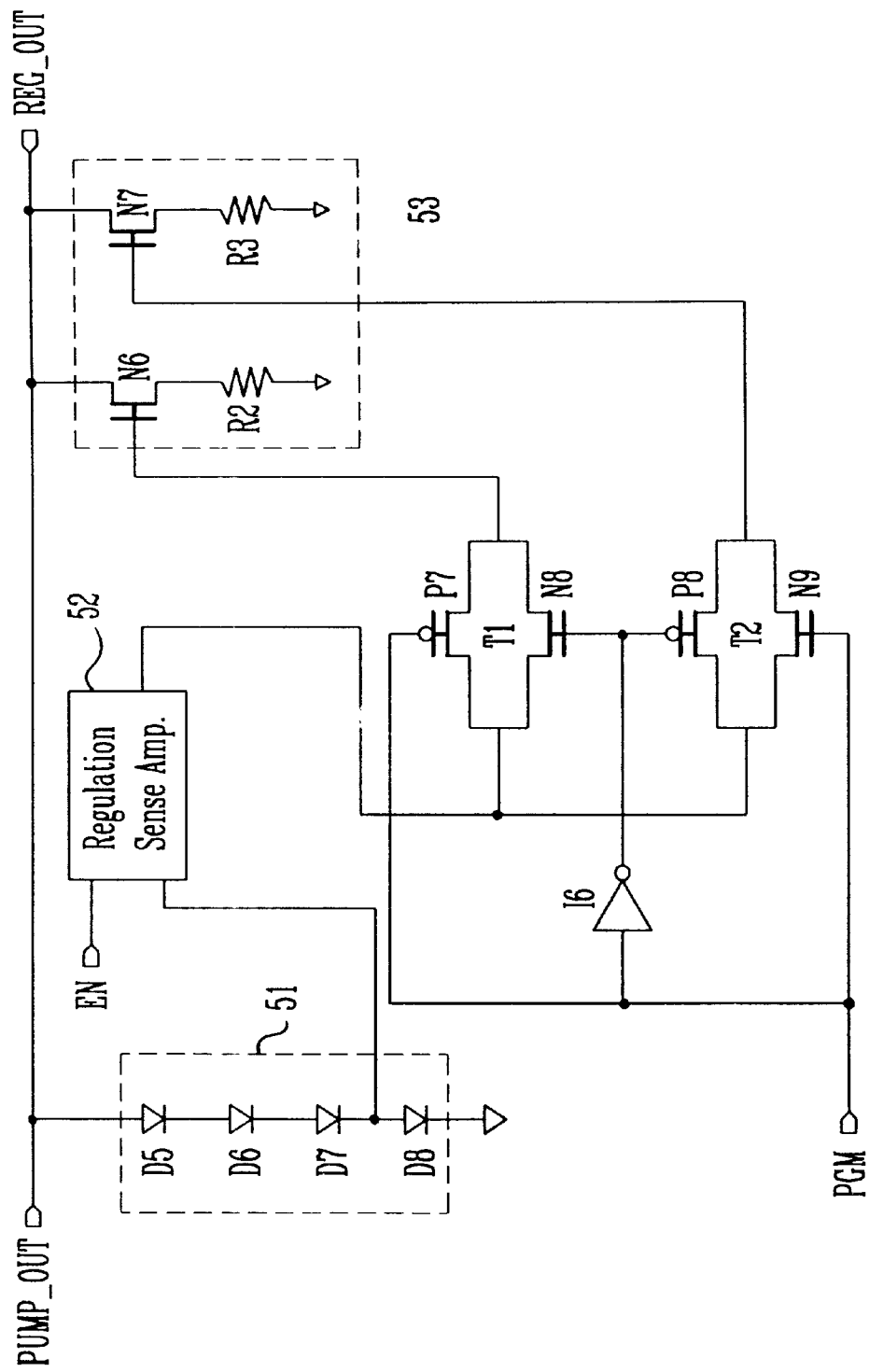
FIG. 5 is an internal circuit diagram for explaining the regulator shown in FIG. 2.

FIG. 5 is an internal circuit diagram of the regulator 50.

The regulator 50 acts to set a corresponding current path in order to make a bias level suitable for the programming or the programming verification of the cell, depending on the bias level specification signal OUTPUT and the program signal PGM.

Also, the regulator 50 is consisted of a supply power divider 51, a regulation sense amplifier 52, a fifth inverter I6 for inverting the program signal PGM, first and second transfer gates T1 and T2 and a current path section 53.

The supply power divider 51 acts to fall the voltage of the level specification signal OUTPUT of the bias switch circuit 40 using a plurality of diodes D5–D8.

The regulation sense amplifier 52 senses the signal the voltage of which has fallen by the supply power divider 51 depending on the enable signal EN and then sends the output signal to the first and second transfer gates.

However, one of the first and second transfer gates T1 and T2 is turned on depending on the program signal PGM and the fifth inverter I6 to send the output signal from the regulation sense amplifier 52 to the current path section 53.

In order to generate a bias level for a programming verification of a cell, the current path for falling the pump-out voltage PUMP_OUT is consisted of a tenth switching element N6 switched depending on the first transfer gate T1, and a first resistor R2 connected between the tenth switching element N6 and the ground to fall the voltage level of the bias level specification signal OUTPUT. Similarly, in order to generate a bias level for a programming of a cell, a current path for falling the pump-out voltage PUMP_OUT is consisted of a eleventh switching element N7 switched depending on the second transfer gate T2, and a second resistor R3 connected between the eleventh switching element N7 and the ground to fall the voltage level of the bias level specification signal OUTPUT.

Now, the operations of the programming and the programming verification performed by the bias level generation circuit in the flash memory device according to the present invention will be explained in detail.

Firstly, the operation of generating a bias level for the programming of the cell by applying the program signal PGM with a High state will be explained.

Referring to FIG. 2 again, if the enable signal EN and the program signal PGM are applied with a High state, the first switching element P2 depending on the first inverter I2 sends the power supply to the charge pump 30. The charge pump 30 generates the pump-out voltage PUMP_OUT necessary for the programming and the programming verification of the cell to apply it to the bias switch circuit 40.

Referring now to FIG. 3, the first high voltage latch circuit 41 generates the output signal Vout1 by the program signal PGM. According to the output signal of the third inverter I4 that inverted the program signal PGM, the second switching element P3 transfers the first output signal Vout1 to the output terminal OUTPUT. Then, the output signal of the second high voltage latch circuit 42 has no effect on the third switching element P4 kept OFF by the program signal PGM.

Referring now to FIG. 4, the operation of the first high voltage latch circuit 41 will be explained. The program signal PGM of a High state is applied to the first input terminal Vin and the pump-out voltage PUMP_OUT is applied to the second input terminal Vppin. Then, the fourth switching element N3 is turned on depending on the program signal PGM, and the ground potential is applied to the first node A01 by the fifth switching element that is always kept ON by the power supply. The ninth switching element P6 is turned on by the voltage level of the first node A01, and the pump-out voltage PUMP_OUT applied to the second input terminal Vppin is transferred to the second node A02. Thus, the pump-out voltage is outputted as an output signal via the output terminal Vout.

Referring now to FIG. 5, thus generated pump-out voltage PUMP_OUT is applied to the supply power divider 51 in the regulator 50. The supply power divider 51 in which a plurality of voltage-fall diodes are serially connected falls the pump-out voltage PUMP_OUT to a given voltage and thus applies it the regulation sense amplifier 52 that is driven depending on the enable signal EN. Then, the output signal of the regulation sense amplifier 52 is applied to the gate of the eleventh switching element N7 in the current path section 53, by the second transfer gate T2 kept ON by the fifth inverter I6 that inverted the program signal PGM. Thus, the eleventh switching element N7 is turned on, thus forming a current path from the second resistor R3 to the ground.

Due to this, the pump-out voltage PUMP_OUT is controlled to be a bias level for the programming of the cell in the flash memory device, by the current path finally formed by the program signal PGM.

Secondly, the operation of generating the bias level for the programming verification of the cell by applying the program signal PGM with a Low state will be explained below.

Referring now to FIG. 2, if the enable signal EN having a High state and the program state PGM having a Low state are applied, the first switching element P2 depending on the first inverter I2 transfers the power supply to the charge pump 30. Then, the charge pump 30 generates the pump-out voltage PUMP_OUT necessary for the programming or the programming verification of the cell to apply it to the bias switch circuit 40.

Referring FIG. 3, the second high voltage latch circuit 42 generates the second output signal Vout2 using the program signal PGM. According to the program signal PGM, the third switching element P4 transfers the second output signal Vout2 to the output terminal OUTPUT. At this time, as the generated voltage is used as the bias level for the programming verification of the cell, the capacitor C1 is connected to the output terminal of the second high voltage latch circuit 42 in order to prevent an abrupt over-current. The output signal of the first high voltage latch circuit 41 has no effect on the second switching element P3 kept Off by the output signal of the second inverter I4 that inverted the program signal PGM.

Referring now to FIG. 4, the operation of the second high voltage latch circuit 42 will be explained. The output signal of a High state from the second inverter I3 that inverted the program signal PGM is applied to the first input terminal Vin, and the pump-out voltage PUMP_OUT is applied to the second input terminal Vppin. Then, the fourth switching element N3 is turned on by the output signal from the second inverter I3 that inverted the program signal PGM, and the ground potential is applied to the first node A01 by the fifth switching element that is always kept ON by the power supply. The ninth switching element P6 is turned on by the voltage level of the first node A01, and the pump-out voltage PUMP_OUT applied to the second input terminal Vppin is thus transferred to the second node A02. Thus, the pump-out voltage PUMP_OUT is outputted as an output signal via the output terminal Vout.

Referring now to FIG. 5, thus generated pump-out voltage PUMP_OUT is applied to the supply power divider 51 in the regulator 50. The supply power divider 51 in which a plurality of voltage-fall diodes are serially connected falls the pump-out voltage PUMP_OUT to a given voltage and applies the fallen voltage to the regulation sense amplifier 52 that is driven by the enable signal EN. Then, the output signal of the regulation sense amplifier 52 is applied to the gate of the tenth switching element N6 in the current path section 53, by the first transfer gate kept On by the fifth inverter I6 that inverted the program signal PGM. Thus, the tenth switching element N6 is turned on to, thus forming a current path from the first resistor R3 to the ground.

Due to this, the pump-out voltage PUMP_OUT is controlled to be a bias level for the programming verification of the cell in the flash memory device, by the current path finally formed by the program signal PGM. In the above embodiment, the tenth and eleventh switching elements N6 and N7 for forming the current path have different sizes of cells because they could pass different amount of current. In other word, the tenth switching element N6 is a cell connecting the current path in order to generate the bias level for the programming verification of the cell. Also, the eleventh switching element N7 is a cell connecting the current path in order to generate the program bias level of the cell. The tenth switching element N6 is larger in its cell size than the eleventh switching element N7 so that the on-resistance of the tenth switching element is smaller than that of the eleventh switching element. Also, the first capacitor C1 is connected to the output terminal of the second high voltage latch circuit 42 for generating the bias level for the programming verification of the cell. The first capacitor C1 prevents an abrupt over-current, thus preventing an oscillation of the word line.

As mentioned above, the present invention can prevent a malfunction of a device due to oscillation of word lines, by supplying word lines with stabilized bias levels the bias levels of which are different depending on the programming step or the programming verification step.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A bias level generation circuit in a flash memory device, comprising:
   a first inverter for inverting an enable signal;
   a first switching element switched depending on an output signal from said first inverter;
   a charge pump for generating a pump-out voltage needed to generate a bias level depending on a power supply applied via said first switching element and in response to said enable signal;
   a bias switch circuit for preventing oscillation of said pump-out voltage in order to generate a bias level for use in a programming or a programming verification of a cell depending on a program signal, wherein an input of said bias switch circuit is connected to an output of said charge pump; and
   a regulator for making a voltage generated in said bias switch to have a bias level suitable for programming or programming verification of the cell, by setting a specific path current depending on said program signal, wherein an input of said regulator is connected to an output of said bias switch circuit.

2. The bias level generation circuit in a flash memory device according to claim 1, wherein said bias switch circuit comprises:
   second and third inverters for inverting said program signal;
   a first high voltage latch circuit for generating a first output signal to make a bias level for use in the programming of the cell depending on said pump-out voltage and said program signal;
   a second high voltage latch circuit for generating a second output signal to make a bias level for use in the programming verification of the cell depending on said pump-out voltage and said output signal from said second inverter;
   a second switching element for transferring said first output signal to an output terminal of the bias switch circuit, depending on an output signal from said third inverter;
   a first capacitor connected between an output terminal of said second high voltage latch circuit and the ground, for preventing oscillation of said second output signal due to generation of an abrupt high current; and
   a third switching element for transferring said second output signal to the output terminal of the bias switch circuit depending on said program signal.

3. The bias level generation circuit in a flash memory device according to claim 2, wherein each of said high voltage latch circuits comprises:

first and second input terminals and an output terminal;

a fourth inverter for inverting a first input signal applied to the first input terminal of the high voltage latch circuit;

a fourth switching element serially connected between a first node and the ground and also switched depending on said first input signal, and a fifth switching element always kept ON by the power supply;

a sixth switching element serially connected between a second node and the ground and also switched depending on an output signal from said fourth inverter, and a seventh switching element always kept ON by the power supply;

a eighth switching element connected between the second input terminal and said first node, the eighth switching element being switched depending on a voltage level of said second node; and a ninth switching element connected between the second input terminal and said second node and configured to transfer a second input signal applied to the second input terminal to the output terminal of the bias switch circuit, depending on a voltage level of said first node.

4. The bias level generation circuit in a flash memory device according to claim 1, wherein said regulator comprises:

a first input terminal connected to the output terminal of the bias switch circuit;

a second input terminal connected to the program signal;

a regulator output terminal;

a fifth inverter for inverting said program signal;

a supply power divider for distributing the output signal from said bias switch circuit into a plurality of diodes connected in series;

a regulation sense amplifier for sensing a signal, the voltage of which has fallen by said supply power divider, depending on said enable signal;

a current path section for forming a plurality of current paths in order to make the output signal of said bias switch circuit being either a bias level for use in the programming or a bias level for use in the programming verification; and first and second transfer gates for transferring an output signal from said regulation sense amplifier to said current path section as either the programming use or the programming verification use, depending on said program signal and an output of said fifth inverter.

5. The bias level generation circuit in a flash memory device according to claim 4, wherein said current path section comprises:

a tenth switching element responsive to an output from said first transfer gate;

a first resistor connected between said tenth switching element and the ground;

an eleventh switching element responsive to an output from said second transfer gate; and a second resistor connected between said eleventh switching element and the ground.

6. The bias level generation circuit in a flash memory device according to claim 5, wherein said tenth switching element is larger in size than said eleventh switching element.

7. A flash memory device having a bias level generation circuit, the bias generation circuit receiving an enable signal and a program signal as inputs and providing a regulator signal as an output, the bias level generation circuit comprising;

a first inverter configured to invert inverting an enable signal and output a first inverter signal;

a first switching element controlled by said first inverter signal and configured to output a power supply voltage when activated by said first inverter signal;

a charge pump receiving as inputs' said enable signal and said power supply voltage, and configured to output a pump-out voltage in response;

a bias switch circuit receiving as input said program signal and pump-out voltage, the bias switch configured to prevent oscillations of said pump-out voltage and selectively output a bias level for subsequent use in either programming or a programming verification of a cell depending on a program signal, wherein an input of said bias switch circuit is connected to an output of said charge pump; and a regulator receiving as inputs said program signal and said bias level, the regulator configured to set a specific path current and thereby selectively make the bias level output by said bias switch to have a bias level suitable for programming or programming verification of the cell, by setting depending on said program signal, wherein an input of said regulator is connected to an output of said bias switch circuit.

8. The flash memory device according to claim 7, wherein said bias switch circuit comprises:

a first high voltage latch circuit receiving said pump-out voltage and said program signal, and configured to generate a first output signal to make a first bias level for use in the programming of the cell;

a second high voltage latch circuit receiving as inputs said pump-out voltage and an inverted version of said program signal, and configured to generate a second output signal to make a second bias level for use in the programming verification of the cell;

a second switching element responsive to an inverted version of the program signal, and configured to transfer said first output signal to an output terminal of the bias switch circuit;

a third switching element responsive to the program signal, and configured to transfer said second output signal to said output terminal of the bias switch circuit; and a first capacitor connected between an output terminal of the second high voltage latch circuit and the ground, for preventing oscillation of said second output signal due to generation of an abrupt high current.

9. The flash memory device according to claim 8, wherein each of said high voltage latch circuits comprises:

first and second input terminals and an output terminal;

a fourth inverter for inverting a first input signal applied to the first input terminal of the high voltage latch circuit;

a fourth switching element serially connected between a first node and the ground and also switched depending on said first input signal, and a fifth switching element always kept ON by the power supply;

a sixth switching element serially connected between a second node and the ground and also switched depending on an output signal from said fourth inverter, and a seventh switching element always kept ON by the power supply;

a eighth switching element connected between the second input terminal and said first node, the eighth switching element being switched depending on a voltage level of said second node; and a ninth switching element connected between the second input terminal and said second node and configured to transfer a second input signal applied to the second input terminal to the output terminal of the bias switch circuit, depending on a voltage level of said first node.

10. The flash memory device according to claim 7, wherein said regulator comprises:
   a first input terminal connected to the output terminal of the bias switch circuit;
   a second input terminal connected to the program signal;
   a regulator output terminal;
   a fifth inverter for inverting said program signal;
   a supply power divider for distributing the output signal from said bias switch circuit into a plurality of diodes connected in series;
   a regulation sense amplifier for sensing a signal, the voltage of which has fallen by said supply power divider, depending on said enable signal;
   a current path section for forming a plurality of current paths in order to make the output signal of said bias switch circuit being either a bias level for use in the programming or a bias level for use in the programming verification; and
   first and second transfer gates for transferring an output signal from said regulation sense amplifier to said current path section as either the programming use or the programming verification use, depending on said program signal and an output of said fifth inverter.

11. The flash memory device according to claim 10, wherein said current path section comprises:
   a tenth switching element responsive to an output from said first transfer gate;
   a first resistor connected between said tenth switching element and the ground;
   an eleventh switching element responsive to an output from said second transfer gate; and
   a second resistor connected between said eleventh switching element and the ground.

12. The flash memory device according to claim 11, wherein said tenth switching element is larger in size than said eleventh switching element.

13. A bias level generation circuit in a flash memory device, comprising:
   a first inverter for inverting an enable signal;
   a first switching element switched depending on an output signal from said first inverter;
   a charge pump for generating a pump-out voltage needed to generate a bias level depending on a power supply applied via said first switching element and in response to said enable signal;
   a bias switch circuit for preventing oscillation of said pump-out voltage in order to generate a bias level for use in a programming or a programming verification of a cell depending on a program signal;
   a regulator for making a voltage generated in said bias switch to have a bias level suitable for programming or programming verification of the cell, by setting a specific path current depending on said program signal;
   wherein said bias switch circuit comprises:
      second and third inverters for inverting said program signal;
      a first high voltage latch circuit for generating a first output signal to make a bias level for use in the programming of the cell depending on said pump-out voltage and said program signal;
      a second high voltage latch circuit for generating a second output signal to make a bias level for use in the programming verification of the cell depending on said pump-out voltage and said output signal from said second inverter;
      a second switching element for transferring said first output signal to an output terminal of the bias switch circuit, depending on an output signal from said third inverter;
      a first capacitor connected between an output terminal of said second high voltage latch circuit and the ground, for preventing oscillation of said second output signal due to generation of an abrupt high current; and
      a third switching element for transferring said second output signal to the output terminal of the bias switch circuit depending on said program signal.

14. The bias level generation circuit in a flash memory device according to claim 13, wherein each of said high voltage latch circuits comprises:
   first and second input terminals and an output terminal;
   a fourth inverter for inverting a first input signal applied to the first input terminal of the high voltage latch circuit;
   a fourth switching element serially connected between a first node and the ground and also switched depending on said first input signal, and a fifth switching element always kept ON by the power supply;
   a sixth switching element serially connected between a second node and the ground and also switched depending on an output signal from said fourth inverter, and a seventh switching element always kept ON by the power supply;
   a eighth switching element connected between the second input terminal and said first node, the eighth switching element being switched depending on a voltage level of said second node; and
   a ninth switching element connected between the second input terminal and said second node and configured to transfer a second input signal applied to the second input terminal to the output terminal of the bias switch circuit, depending on a voltage level of said first node.

15. The bias level generation circuit in a flash memory device according to claim 13, wherein said regulator comprises:
   a first input terminal connected to the output terminal of the bias switch circuit;
   a second input terminal connected to the program signal;
   a regulator output terminal;
   a fifth inverter for inverting said program signal;
   a supply power divider for distributing the output signal from said bias switch circuit into a plurality of diodes connected in series;
   a regulation sense amplifier for sensing a signal, the voltage of which has fallen by said supply power divider, depending on said enable signal;
   a current path section for forming a plurality of current paths in order to make the output signal of said bias switch circuit being either a bias level for use in the programming or a bias level for use in the programming verification; and
   first and second transfer gates for transferring an output signal from said regulation sense amplifier to said current path section as either the programming use or the programming verification use, depending on said program signal and an output of said fifth inverter.

16. The bias level generation circuit in a flash memory device according to claim 15, wherein said current path section comprises:
- a tenth switching element responsive to an output from said first transfer gate;
- a first resistor connected between said tenth switching element and the ground;
- an eleventh switching element responsive to an output from said second transfer gate; and
- a second resistor connected between said eleventh switching element and the ground.

17. The bias level generation circuit in a flash memory device according to claim 16, wherein said tenth switching element is larger in size than said eleventh switching element.

18. A flash memory device having a bias level generation circuit, the bias level generation circuit receiving an enable signal and a program signal as inputs and providing a regulator signal as an output, the bias level generation circuit comprising:
- a first inverter configured to invert the enable signal and output a first inverter signal;
- a first switching element controlled by said first inverter signal and configured to output a power supply voltage when activated by said first inverter signal;
- a charge pump receiving as inputs said enable signal and said power supply voltage, and configured to output a pump-out voltage in response thereto;
- a bias switch circuit receiving as inputs said program signal and said pump-out voltage, the bias switch circuit configured to prevent oscillations in said pump-out voltage and selectively output a bias level for subsequent use in either programming or programming verification of a cell, depending on said program signal; and
- a regulator receiving as inputs said program signal and said bias level, the regulator configured to set a specific path current and thereby selectively make the bias level output by said bias switch circuit suitable for programming or the programming verification of the cell, depending on said program signal;

wherein said bias switch circuit comprises:
- second and third inverters for inverting said program signal;
- a first high voltage latch circuit for generating a first output signal to make a bias level for use in the programming of the cell depending on said pump-out voltage and said program signal;
- a second high voltage latch circuit for generating a second output signal to make a bias level for use in the programming verification of the cell depending on said pump-out voltage and said output signal from said second inverter;
- a second switching element for transferring said first output signal to an output terminal of the bias switch circuit, depending on an output signal from said third inverter;
- a first capacitor connected between an output terminal of said second high voltage latch circuit and the ground, for preventing oscillation of said second output signal due to generation of an abrupt high current; and
- a third switching element for transferring said second output signal to the output terminal of the bias switch circuit depending on said program signal.

19. The flash memory device according to claim 18, wherein each of said high voltage latch circuits comprises:
- first and second input terminals and an output terminal;
- a fourth inverter for inverting a first input signal applied to the first input terminal of the high voltage latch circuit;
- a fourth switching element serially connected between a first node and the ground and also switched depending on said first input signal, and a fifth switching element always kept ON by the power supply;
- a sixth switching element serially connected between a second node and the ground and also switched depending on an output signal from said fourth inverter, and a seventh switching element always kept ON by the power supply;
- a eighth switching element connected between the second input terminal and said first node, the eighth switching element being switched depending on a voltage level of said second node; and
- a ninth switching element connected between the second input terminal and said second node and configured to transfer a second input signal applied to the second input terminal to the output terminal of the bias switch circuit, depending on a voltage level of said first node.

20. The flash memory device according to claim 18, wherein said regulator comprises:
- a first input terminal connected to the output terminal of the bias switch circuit;
- a second input terminal connected to the program signal;
- a regulator output terminal;
- a fifth inverter for inverting said program signal;
- a supply power divider for distributing the output signal from said bias switch circuit into a plurality of diodes connected in series;
- a regulation sense amplifier for sensing a signal, the voltage of which has fallen by said supply power divider, depending on said enable signal;
- a current path section for forming a plurality of current paths in order to make the output signal of said bias switch circuit being either a bias level for use in the programming or a bias level for use in the programming verification; and
- first and second transfer gates for transferring an output signal from said regulation sense amplifier to said current path section as either the programming use or the programming verification use, depending on said program signal and an output of said fifth inverter.

21. The flash memory device according to claim 20, wherein said current path section comprises:
- a tenth switching element responsive to an output from said first transfer gate;
- a first resistor connected between said tenth switching element and the ground;
- an eleventh switching element responsive to an output from said second transfer gate; and
- a second resistor connected between said eleventh switching element and the ground.

22. The flash memory device according to claim 21, wherein said tenth switching element is larger in size than said eleventh switching element.

23. A flash memory device having a bias level generation circuit incorporated therein, wherein the bias level generation circuit comprises:
- a charge pump having a first input configured to receive an enable signal, the charge pump also having a second input configured to receive a power supply voltage controlled by said enable signal, the charge pump having an output configured to supply a pump-out voltage in response to said inputs;

a bias switch circuit having a first input connected to the output of the charge pump so as to receive the pump-out voltage, the bias switch circuit also having a second input configured to receive a program signal, the bias switch circuit having an output configured to selectively supply a bias level for subsequent use in either programming or a programming verification, depending on the program signal; and a regulator having a first input connected to the output of the bias switch circuit so as to receive the bias level, the regulator also having a second input configured to receive said program signal, the regulator having a first current path which is invoked when the program signal indicates programming verification of a memory cell of the flash memory device, and a second current path which is invoked when the program signal indicates programming of said memory cell of the flash memory device.

* * * * *